(12) United States Patent
Kaschner et al.

(10) Patent No.: US 9,275,974 B2
(45) Date of Patent: Mar. 1, 2016

(54) OPTICAL SENSOR CHIP DEVICE AND CORRESPONDING PRODUCTION METHOD

(71) Applicants: Axel Kaschner, Pittsburgh, PA (US); Michael Krueger, Reutlingen (DE)

(72) Inventors: Axel Kaschner, Pittsburgh, PA (US); Michael Krueger, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 16 days.

(21) Appl. No.: 14/177,722

(22) Filed: Feb. 11, 2014

(65) Prior Publication Data
US 2014/0225212 A1    Aug. 14, 2014

(30) Foreign Application Priority Data
Feb. 11, 2013   (DE) .................. 10 2013 202 170

(51) Int. Cl.
| | |
|---|---|
| H01L 25/04 | (2014.01) |
| H01L 25/00 | (2006.01) |
| H01L 31/0232 | (2014.01) |
| H01L 25/065 | (2006.01) |
| H01L 27/146 | (2006.01) |

(52) U.S. Cl.
CPC .......... *H01L 25/042* (2013.01); *H01L 25/0655* (2013.01); *H01L 25/50* (2013.01); *H01L 27/14618* (2013.01); *H01L 31/02325* (2013.01); *H01L 27/14649* (2013.01); *H01L 27/14669* (2013.01); *H01L 2924/0002* (2013.01)

(58) Field of Classification Search
USPC ......................................................... 257/443
See application file for complete search history.

(56) References Cited

U.S. PATENT DOCUMENTS

| | | | | |
|---|---|---|---|---|
| 5,801,402 | A | * | 9/1998 | Shin ..................... G11B 7/1205 257/80 |
| 8,362,496 | B1 | | 1/2013 | Tu et al. |
| 8,946,620 | B2 | * | 2/2015 | Loong .................. G01S 17/026 250/221 |
| 2001/0020545 | A1 | * | 9/2001 | Eldridge et al. .............. 174/260 |
| 2003/0059178 | A1 | * | 3/2003 | Kobayashi ........... G02B 6/4206 385/94 |
| 2007/0289771 | A1 | | 12/2007 | Osaka et al. |
| 2010/0044722 | A1 | * | 2/2010 | Lai .................... H01L 27/14618 257/80 |
| 2010/0046577 | A1 | | 2/2010 | Sheard et al. |
| 2013/0009173 | A1 | * | 1/2013 | Vittu .................... G01S 7/4813 257/82 |
| 2013/0073681 | A1 | * | 3/2013 | Jiang et al. .................... 709/218 |

FOREIGN PATENT DOCUMENTS

| | | |
|---|---|---|
| DE | 10 2009 027 321 | 1/2011 |
| DE | 10 2009 045 385 | 4/2011 |

* cited by examiner

*Primary Examiner* — Zandra Smith
*Assistant Examiner* — Lawrence Tynes, Jr.
(74) *Attorney, Agent, or Firm* — Kenyon & Kenyon LLP

(57) ABSTRACT

An optical sensor chip device and a corresponding production method. The optical sensor chip device includes a substrate having a front side and a rear side; at least one first optical sensor chip for acquiring a first optical spectral range, the chip being attached to the substrate; and a first sealed cavern fashioned above an upper side of the first optical sensor chip. The first optical sensor chip is situated on a first side of the first cavern, and a first optical device is situated on an opposite, second side of the first cavern.

13 Claims, 7 Drawing Sheets

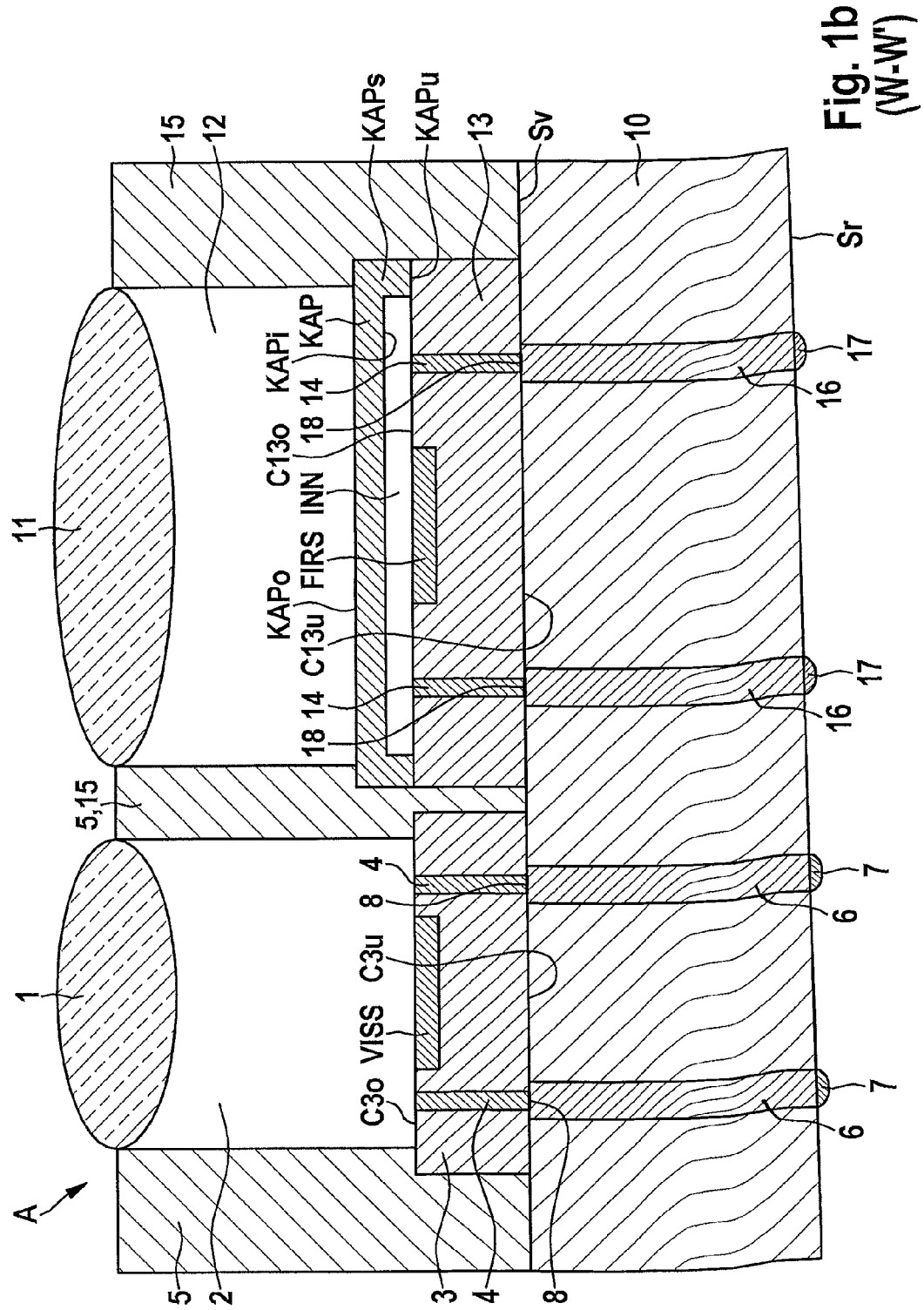

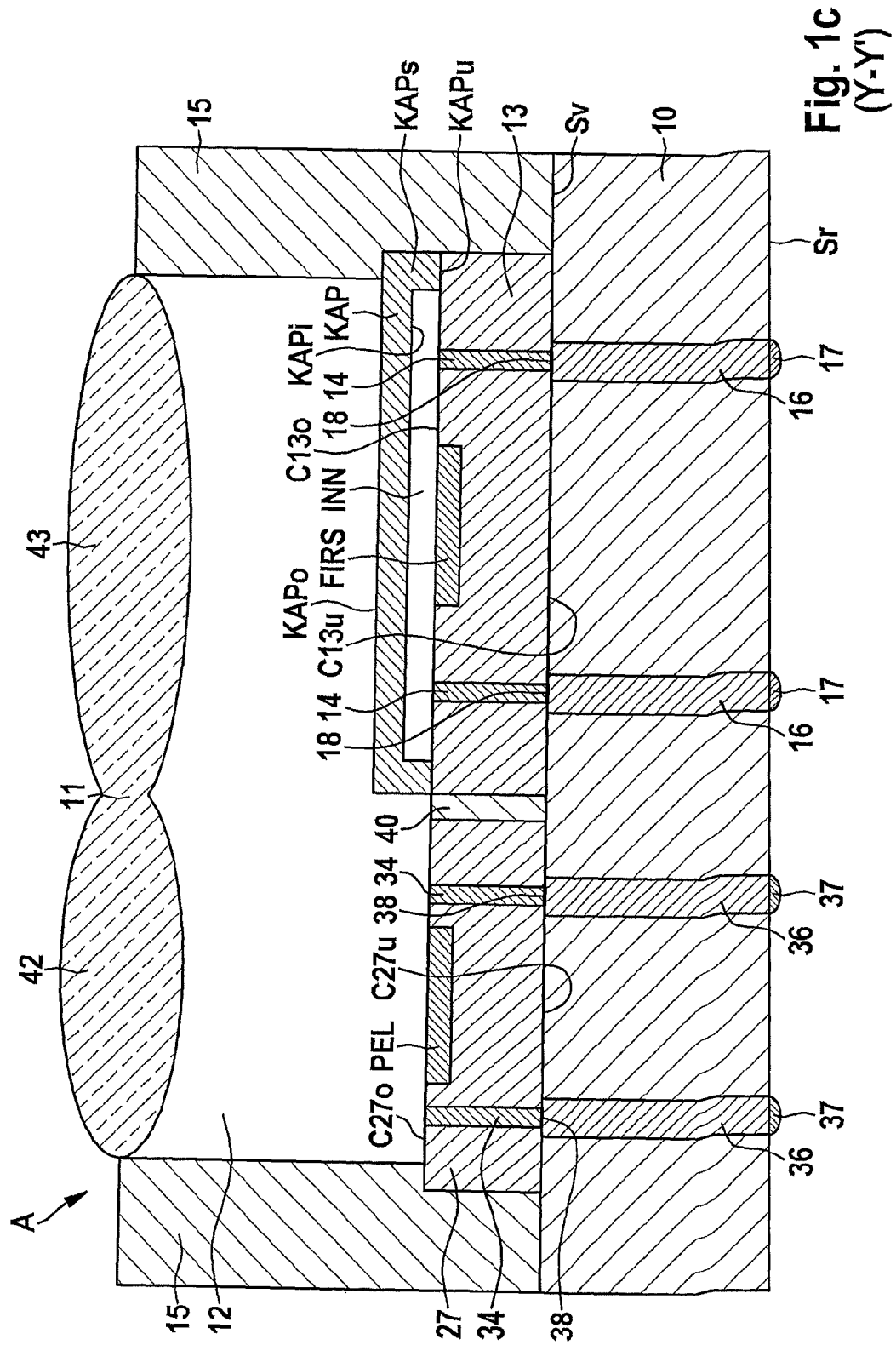

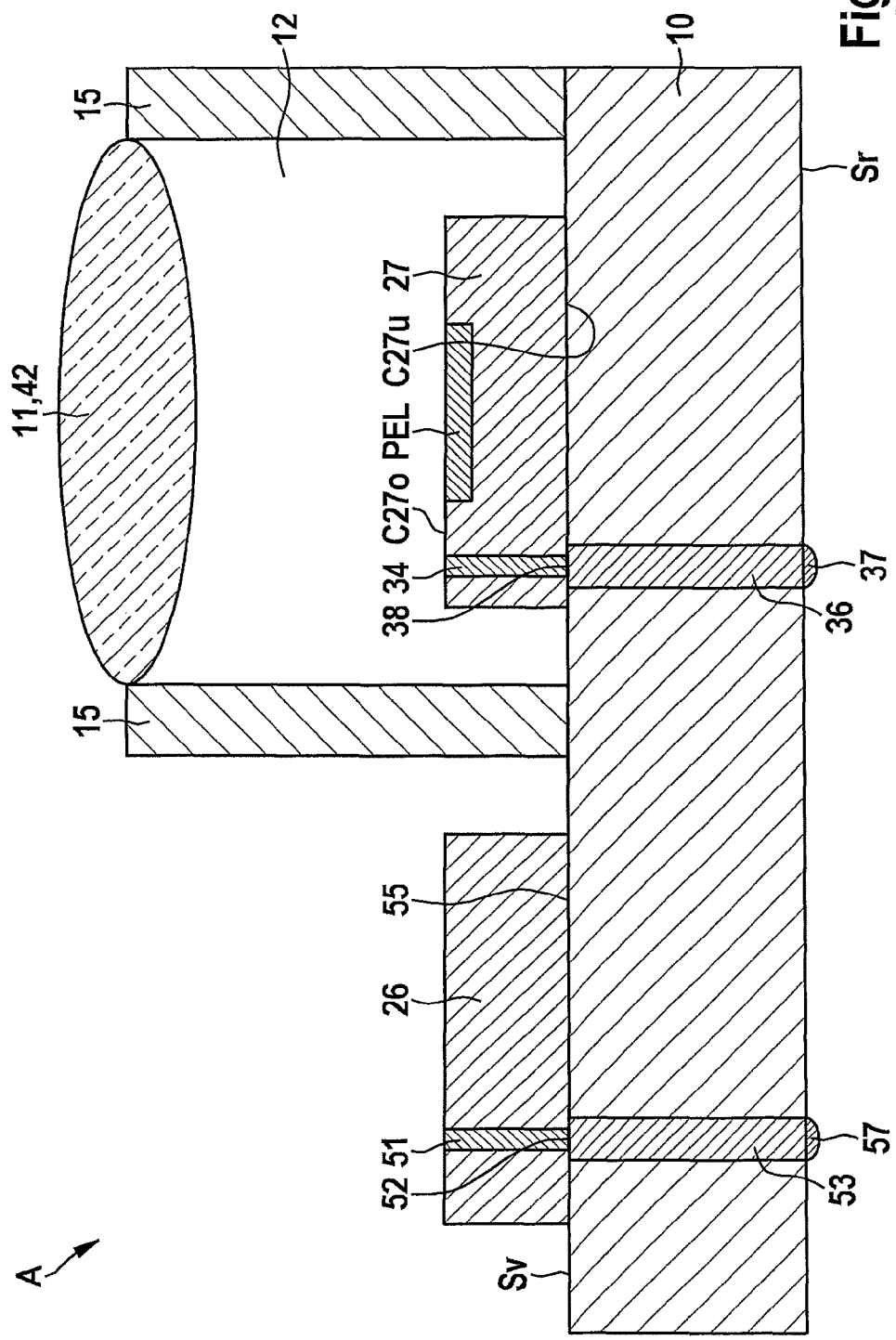

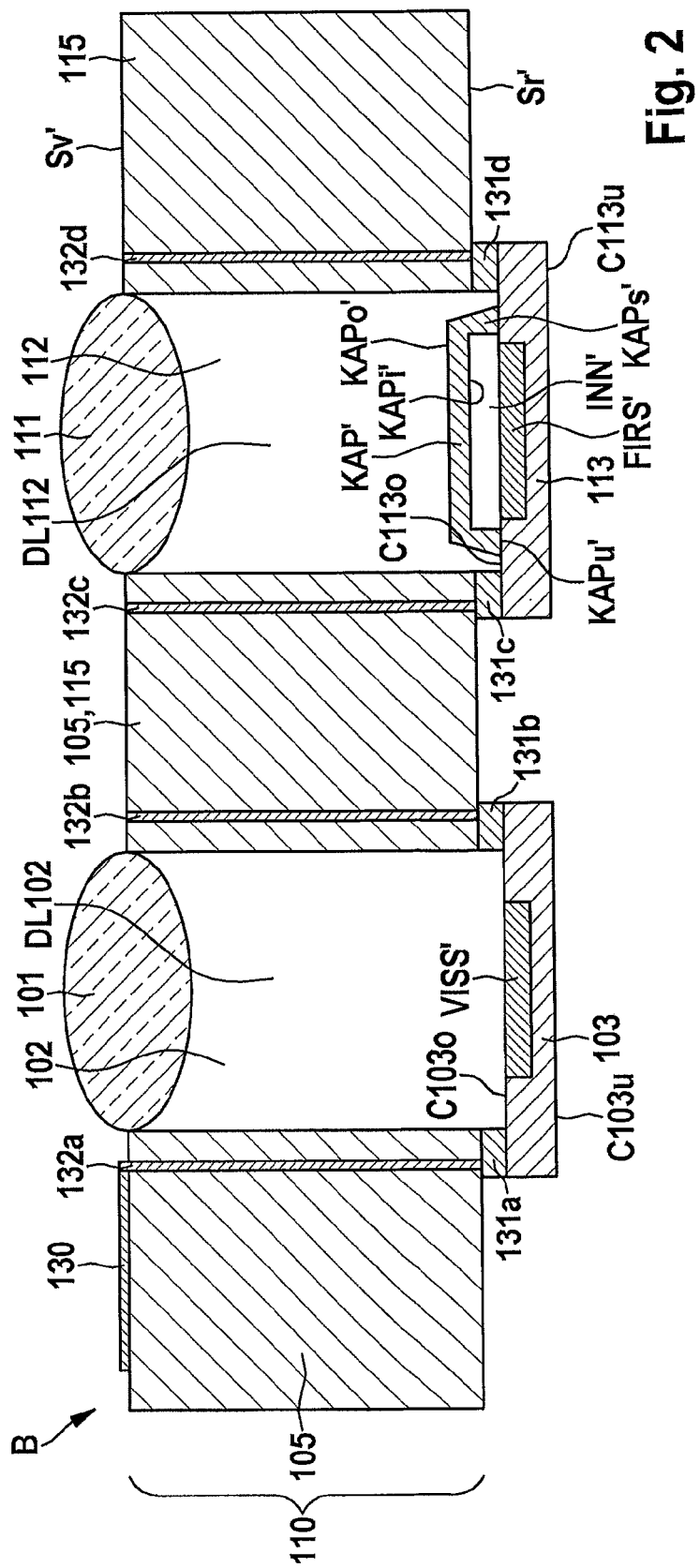

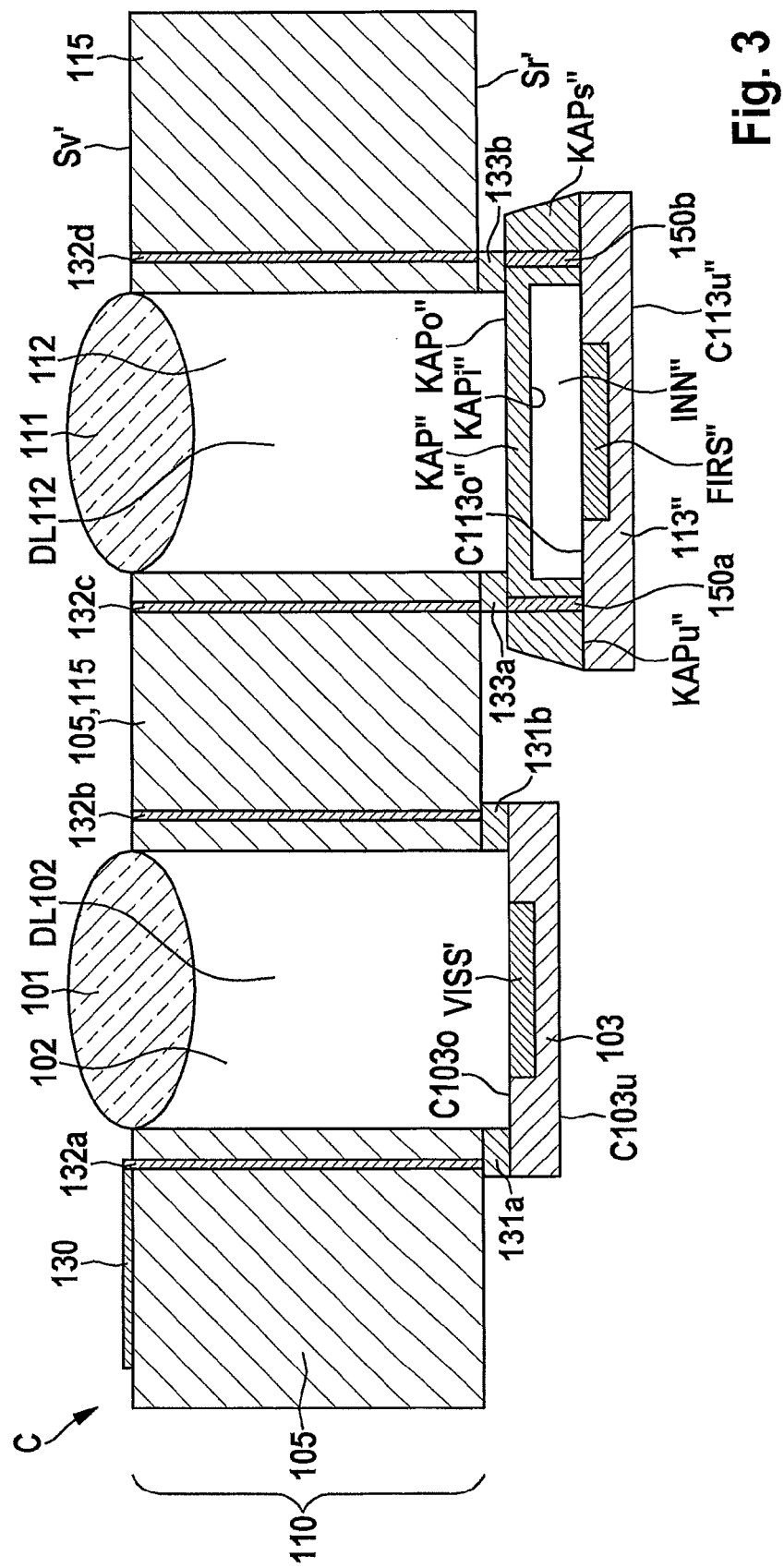

OPTICAL SENSOR CHIP DEVICE AND CORRESPONDING PRODUCTION METHOD

CROSS REFERENCE

The present application claims the benefit under 35 U.S.C. §119 of German Patent Application No. DE 10 2013 202 170.4 filed on Feb. 11, 2013, which is expressly incorporated herein by reference in its entirety.

FIELD

The present invention relates to an optical sensor chip device and to a corresponding production method.

BACKGROUND INFORMATION

Today there are commercially available products, such as thermography cameras, that enable imaging both in the visible wavelength range (VIS) and in the long-wavelength infrared range (FIR). By data fusion of both signals, it is possible to represent recorded exposures in the visible and in the infrared range in superposed fashion. In the corresponding devices, two light paths are correspondingly installed, usually on circuit boards, having corresponding optical equipment and detectors.

U.S. Published Application No. 2010/0046577 A1 describes a device for use in a thermal measuring instrument. The device contains an infrared camera module, and can also contain a camera module for acquiring visible light. Here, various temperature sensors are installed on an integrated circuit board.

U.S. Published Application No. 2007/0289771 A1 describes a multi-chip semiconductor device in which a plurality of chips are bonded onto a substrate, and the chips are electrically connected to one another via through-platings, and are electrically connected to further lines.

U.S. Pat. No. 8,362,496 B1 describes an optical module packet unit having a light-emitting chip and a light sensor chip that are attached in recesses of a plastic cover on a substrate, and are surrounded by fixedly adherent packaging structures.

SUMMARY

In accordance with the present invention, an optical sensor chip device is realized having one or more optical sensor chips and corresponding optical devices are realized, e.g., lens devices, with corresponding mounting and connection technology on a low, e.g., first, packaging level.

Through integration and miniaturization, it is possible on the one hand to make the constructive form smaller, and on the other hand to reduce costs. The cost reduction is due to a reduced outlay in the mounting and connection technology, because low-cost components can be used, and a lower expense is incurred during adjustment and calibration, because the components can be mechanically positioned relative to one another with precision at the micrometer level.

In addition, the present invention enables a modular design, because further components, such as a microcontroller for data processing and/or a sensor for realizing a wake-up function, can be integrated into the device.

The present invention can thus be used for example not only as a thermography camera, but also in security applications or interior surveillance, without using a large amount of current or producing a large amount of data traffic.

According to a preferred specific embodiment, the optical sensor chip device according to the present invention includes a second optical sensor chip for acquiring a second optical range of the spectrum, and a second closed cavern fashioned above an upper side of the second optical sensor chip, the second optical sensor chip being situated on a first side of the second cavern and a second optical device being situated on an opposite, second side of the second cavern. In this way, different sensor chips can be combined with a savings of space.

According to a further preferred specific embodiment, the optical sensor chip or chips are bonded onto the front side of the substrate via their respective lower side, the respective cavern being limited laterally by a respective rim attached on the front side of the substrate. In this way, a packaging can be produced in a self-orienting manner.

According to a further preferred specific embodiment, the optical sensor chip or chips are bonded onto the rear side of the substrate via their respective upper side, the respective cavern being laterally limited, at least in some regions, by a respective through-hole that passes through the substrate. In this way, a particularly space-saving configuration can be achieved, in particular if the respective optical device is attached on the front side of the substrate at the associated through-hole.

According to a further preferred specific embodiment, the respective cavern is laterally limited above the substrate by a respective rim that is connected to the through-hole and is attached to the front side of the substrate. Thus, as needed the spacing between the optical sensor chip and the optical device can be precisely adjusted. In this way, in particular in optical devices in which a larger spacing is necessary, for example lenses having a large focal distance, the required spacing can for example be realized at low cost by using plastic for the rims.

According to a further preferred specific embodiment, the optical sensor chip and/or chips each have through-platings that lead from the respective upper side to the respective lower side of the optical sensor chip and are bonded to corresponding through-platings of the substrate. In this way, a simple rear-side contacting of the entire sensor chip device can be realized.

According to a further preferred specific embodiment, on the upper side of at least one optical sensor chip a cap is formed that encloses a hollow space having a specified atmosphere, in particular a vacuum. This promotes the functioning of certain sensor chips.

According to a further preferred specific embodiment, the first optical sensor chip is fashioned for the acquisition of visible light and the second optical sensor chip is fashioned for the acquisition of electromagnetic radiation in the infrared range, the corresponding optical devices being lens devices. In this way, for example a VIS/FIR camera device can be realized at low cost.

According to a further preferred specific embodiment, the respective lateral rim covers the associated sensor chip or chips at least in some regions. In this way, at the same time an edge passivation and in addition a scattered light barrier can be created.

According to a further preferred specific embodiment, a wake-up chip device and/or a microcontroller is attached to the substrate. This further increases the degree of integration. This wake-up sensor can for example be an acoustic sensor, a capacitive sensor, or an optical sensor, such as a pyroelectric sensor, or can be a movement sensor. The microcontroller can be used for example for data compression.

According to a further preferred specific embodiment, the substrate is a semiconductor substrate or glass substrate, and the respective rim is a molding compound. Preferably, the substrate is a pre-molded housing.

BRIEF DESCRIPTION OF THE DRAWINGS

In the following, the present invention is explained in more detail based on exemplary embodiments shown in the figures.

FIGS. 1a-d show schematic sectional representations for the explanation of an optical sensor chip device according to a first specific embodiment of the present invention; FIG. 1a shows a horizontal sectional view, FIG. 1b shows a vertical sectional view along the line W-W' in FIG. 1a, FIG. 1c shows a vertical sectional view along the line Y-Y' in FIG. 1a, and FIG. 1d shows a vertical sectional view along the line X-X' in FIG. 1a.

FIG. 2 shows a schematic vertical sectional view for the explanation of an optical sensor chip device according to a second specific embodiment of the present invention, in a representation of analogous to that of FIG. 1b.

FIG. 3 shows a schematic vertical sectional view for the explanation of an optical sensor chip device according to a third specific embodiment of the present invention, in a representation analogous to that of FIG. 1b.

DETAILED DESCRIPTION OF EXAMPLE EMBODIMENTS

Figure 1A:
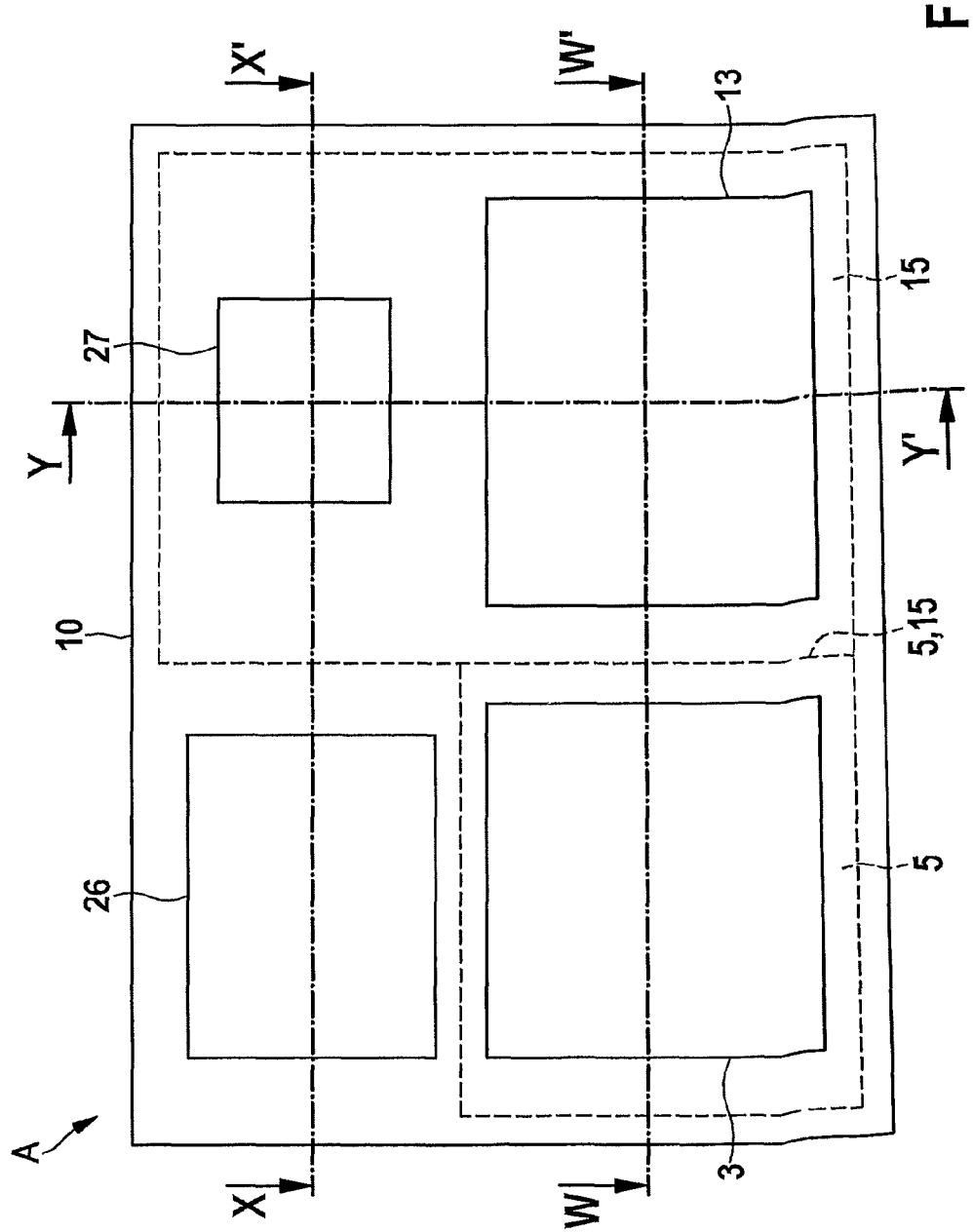

In the Figures, identical reference characters designate identical or functionally identical elements.

FIGS. 1a-d are schematic sectional representations for the explanation of an optical sensor chip device according to a first specific embodiment of the present invention; FIG. 1a shows a horizontal sectional view, FIG. 1b shows a vertical sectional view along the line W-W' in FIG. 1a, FIG. 1c shows a vertical sectional view along the line Y-Y' in FIG. 1a, and FIG. 1d shows a vertical sectional view along the line X-X' in FIG. 1a.

Optical sensor chip device A according to a first specific embodiment includes, with reference to FIG. 1a, a substrate 10 that is made for example of silicon, ceramic, glass, or similar materials, and that can have a thickness of from a few 100 μm to a few 10 mm. On substrate 10 there are situated a VIS array chip 3, an FIR array chip 13, a wake-up chip 27, and a microcontroller 26, situated at a distance from one another and electrically contacted to one another. VIS array chip 3 is surrounded by a first rim 5, and FIR array chip 13 and wake-up chip 27 are surrounded by a second rim 15.

VIS array chip 3 is a chip for acquiring visible light (VIS). FIR array chip 13 is a chip for acquiring electromagnetic signals in the long-wave infrared range (far infrared, FIR). Wake-up chip 27 can be used to activate the optical sensor chip device from an energy-saving sleep mode. For the rim 5, 15, a purely mechanical interposer, e.g., made of silicon, plastic, or metal, can be used; its construction can however for example also be realized in a so-called premolded or molded housing.

According to FIG. 1b, VIS array chip 3 is bonded with its lower side C3u to front side Sv of substrate 10. On upper side C3o of VIS array chip 3, there is situated an integrated sensor device VISS for acquiring visible light. First through-platings 4 run through VIS array chip 3, from its upper side C3o to its lower side C3u. For these first through-platings 4 and for all further through-platings described below, various technologies can be used, e.g., metal vias, doped polysilicon or through-silicon vias (TSVs), as described in German Patent Application No. DE 10 2009 027 321 A1 or in German Patent Application No. DE 10 2009 045 385 A1. First through-platings 4 meet second through-platings 6 in substrate 10 via first bond connections 8.

A part of upper side C3o of VIS array chip 3 is covered by first rim 5, and another part of upper side C3o of VIS array chip 3 is situated inside first cavern 2.

First bonding regions 7 are situated at the ends of second through-platings 6 on rear side Sr of substrate 10. Thus, chips 3, 13 can be electrically contacted from rear side Sr. Above upper side C3o of VIS array chip 3, there is situated a first cavern 2 surrounded by first rim 5. On the side of first cavern 2 that is situated opposite upper side C3o of VIS array chip 3, first cavern 2 is sealed by an optical lens device 1 designed for visible light.

Moreover, an FIR array chip 13 is bonded on substrate 10 in such a way that its lower side C13u is oriented toward front side Sv of substrate 10. Third through-platings 14 lead through FIR array chip 13, from upper side C13o of FIR array chip 13 to lower side C13u of FIR array chip 13. There, at second bond connections 18 they meet fourth through-platings 16, which run through substrate 10, from front side Sv of substrate 10 to rear side Sr of substrate 10. Fourth through-platings 16 end at rear side Sr of substrate 10, at second bonding regions 17.

Upper side C13o of FIR array chip 13 has an infrared sensor device FIRS. Above upper side C13o of FIR array chip 13 there is situated a cap KAP that, together with upper side C13o of FIR array chip 13, encloses an interior space INN. Lower side KAPu of cap KAP is attached on upper side C13o of FIR array chip 13. Interior space INN is limited from below by upper side C13o of FIR array chip 13, and is limited at the sides by cap side segments KAPs of cap KAP, and is limited at the upper side by cap inner side KAPi of cap KAP. This interior space INN has low pressure, preferably a vacuum, in order for example to enable the acquisition of infrared radiation in bolometers.

A second cavern 12 is connected above cap upper side KAPo of cap KAP. Second cavern 12 is limited at its sides by second rim 15. At the side situated opposite cap upper side KAPo, second cavern 12 is sealed by an infrared lens device 11. According to FIG. 1b, a part of cap upper side KAPo is covered by second rim 15, and another part of cap upper side KAPo is situated inside second cavern 12.

According to FIG. 1c, a wake-up chip 27 is bonded, at its lower side C27u, on front side Sv of substrate 10. A pyroelectrical sensor device PEL is situated on upper side C27o of wake-up chip 27. Fifth through-platings 34 run through wake-up chip 27, from upper side C27o of wake-up chip 27 to lower side C27u of wake-up chip 27. At lower side C27u of wake-up chip 27, fifth through-platings 34 are connected via third bonding connections 38 to sixth through-platings 36, which run from front side Sv of substrate 10 to rear side Sr of substrate 10, where they end in third bonding regions 37.

According to FIG. 1c, a part of cap upper side KAPo is covered by second rim segments 15, and another part of cap upper side KAPo is situated inside second cavern 12. An intermediate space 40 is situated between wake-up chip 27 and FIR array chip 13. Infrared lens device 11 has a region having a facet structure 42 of infrared lens device 11 above wake-up chip 27, and has a region having a lens structure 43 of infrared lens device 11 above FIR array chip 13.

According to FIG. 1d, a microcontroller 26 is bonded onto front side Sv of substrate 10 via microcontroller lower side 55. Microcontroller 26 has seventh through-platings 51 that lead from microcontroller upper side 54 to microcontroller lower side 55. At microcontroller lower side 55, seventh through-platings 51 end in fourth bonded connections 52, where they are connected to eighth through-platings 53. Eighth through-platings 53 lead from front side Sv of substrate 10 to rear side Sr of the substrate, and end in fourth bonding regions 57.

During operation, signals based on the acquired electromagnetic signals can be outputted by optical chips 3, 13, and further processed in the microcontroller. The optical chip sensor device can also be set, using the microcontroller, in such a way that, under specified conditions, it goes into a sleep state in which it for example causes less data traffic and consumes less power. The wake-up sensor can be used to bring the system back into operation-ready mode under specified conditions, for example when a heat source is acquired.

FIG. 2 is a schematic vertical sectional representation for the explanation of an optical sensor chip device according to a second specific embodiment of the present invention, in a representation analogous to that shown in FIG. 1b.

The optical sensor chip device according to the second specific embodiment is designated with reference character B. According to FIG. 2, a VIS array chip 103 is attached to rear side Sr' of a substrate 110 in such a way that upper side C103o of VIS array chip 103 is oriented toward substrate 110. Substrate 110 can be made of silicon, ceramic, glass, or similar materials, and can have a thickness of from some 100 μm to some 10 mm.

Upper side C103o of VIS array chip 103 has a sensor device VISS' for acquiring visible light. On a part of upper side C103o of VIS array chip 103, there are situated first bonding regions 131a, electrically connected to a peripheral wire 130 via first through-platings 132a that run through substrate 110.

At another region of upper side C103o of VIS array chip 103 there are situated second bonding regions 131b that are electrically connected to second through-platings 132b through substrate 110. VIS array chip 103 also has a lower side C103u.

A first cavern extends above upper side C103o of VIS array chip 103. A predominant part of first cavern 102 is formed by a first through-hole DL102 that runs from front side Sv' of substrate 110 to rear side Sr' of substrate 110. A rim 105 that laterally limits first cavern 102 is formed by corresponding segments of substrate 110. The side of first cavern 102 situated opposite upper side C103o of VIS array chip 103 is sealed by an optical lens device 101 designed for visible light.

Moreover, an FIR array chip 113 for acquiring electromagnetic signals in the infrared range is attached to rear side Sr' of substrate 110 in such a way that upper side C113o of FIR array chip 113 is oriented toward substrate 110. On its upper side C113o, FIR array chip 113 has an infrared sensor device FIRS'. FIR array chip 113 also has a lower side C113u.

Third and fourth bonding regions 131c and 131d are situated on regions of upper side C113o of FIR array chip 113, these bonding regions being connected electrically to corresponding third and fourth through-platings 132c and 132d. Moreover, on upper side C113o of FIR array chip 113 there is situated cap KAP', which together with upper side C113o of FIR array chip 113 encloses an interior space INN'. Here, lower side KAPu' of cap KAP' is attached to upper side C113o of FIR array chip 113. Interior space INN' is limited from below by upper side C113o of FIR array chip 113, and is limited at the sides by cap side segments KAPs' of cap KAP', and is limited at the upper side by cap inner side KAPi' of cap KAP'. The pressure in interior space INN' is low pressure, preferably a vacuum.

Cap upper side KAPo' of cap KAP' is situated inside a second cavern 112 having a second cavern limiting 112i. Second cavern 112 is also predominantly made up of a second through-hole DL112 that runs from front side Sv' through substrate 110 to rear side Sr' of substrate 110. A rim 115 that limits second cavern 112 is formed by corresponding segments of substrate 110.

The side of second cavern 112 situated opposite upper side C113o of FIR array chip 113 is sealed by an infrared lens device 111.

FIG. 3 is a schematic vertical sectional representation for the explanation of an optical sensor chip device according to a third specific embodiment of the present invention, in a representation analogous to that shown in FIG. 1b.

Optical sensor chip device C according to the third specific embodiment is a variant of the second specific embodiment.

Here, a cap KAP" is attached, with upper side KAPo" of cap KAP", to rear side Sr' of substrate 110 in such a way that it covers the side of second cavern 112 situated opposite infrared lens device ill. On upper side KAPo" of cap KAP" there are situated third and fourth bonding regions 133a, 133b that are respectively connected in electrically conductive fashion to third and fourth through-platings 132c, 132d.

On the side facing away from substrate 110, third and fourth bonding regions 133a, 133b are correspondingly connected to fifth and sixth through-platings 150a, 150b. Fifth and sixth through-platings 150a, 150b run from cap upper side KAPo" through cap KAP" to cap lower side KAPu", on which FIR array chip 113" is attached with its upper side C113o". FIR array chip 113" moreover has a lower side C113u". Together with upper side C113o" of FIR array chip 113", cap inner side KAPi" of cap KAP" encloses an interior space INN".

Interior space INN" is here limited from below by upper side C113o" of FIR array chip 113", and is limited at the sides by cap side segment KAPs" of cap KAP", and is limited from above by cap inner side KAPi". The pressure in interior space INN" is low pressure, preferably a vacuum. The region of upper side C113o" of FIR array chip 113" that forms the lower limit of interior space INN" has an infrared sensor device FIRS".

Figure 4:
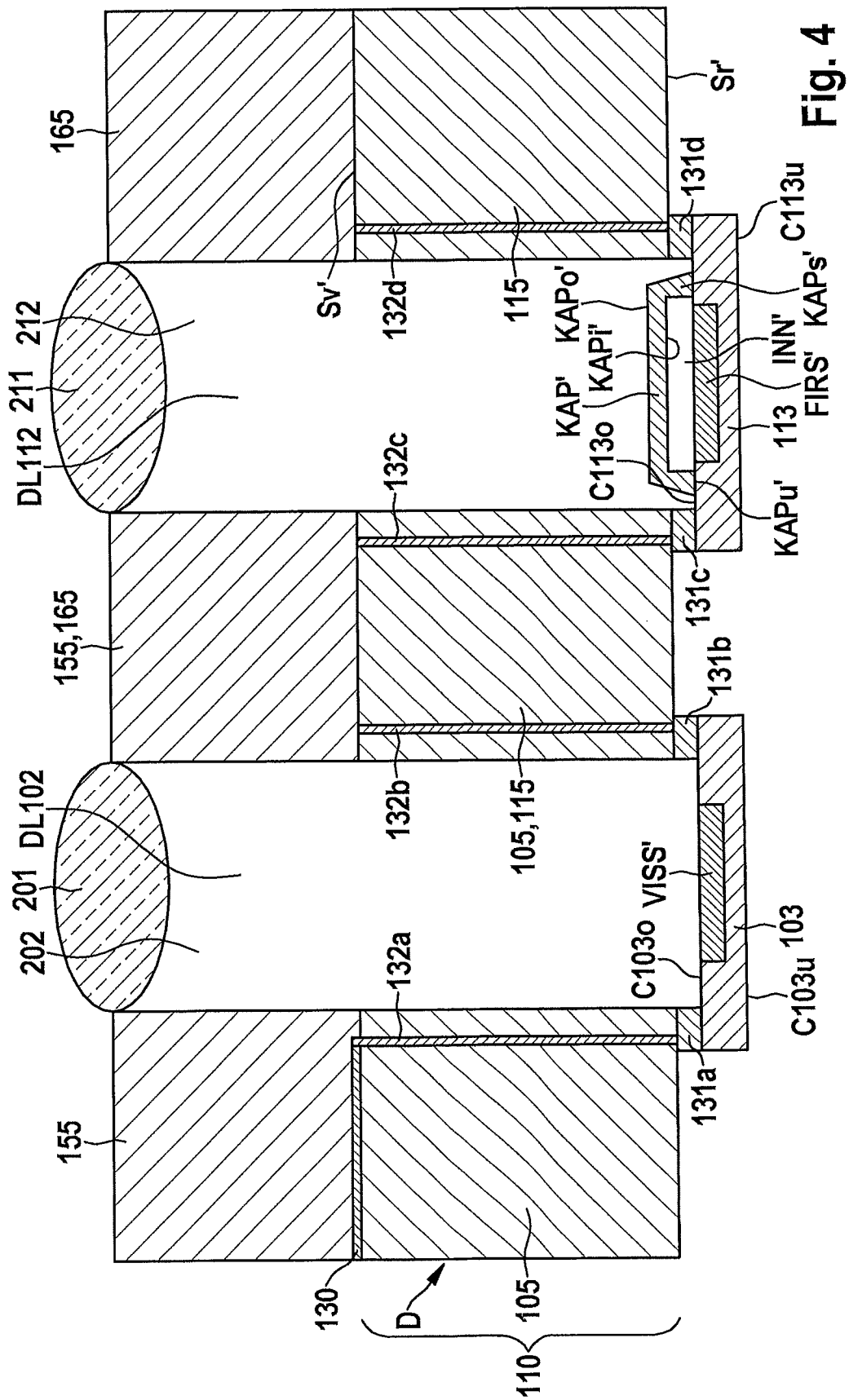
FIG. 4 shows a schematic vertical sectional view for the explanation of an optical sensor chip device according to a third specific embodiment of the present invention, in a representation analogous to that of FIG. 1b.

FIG. 4 is a schematic vertical sectional representation for the explanation of an optical sensor chip device according to a third specific embodiment of the present invention, in a representation analogous to that shown in FIG. 1a.

Optical sensor chip device D according to the fourth specific embodiment is a further variant of the second specific embodiment.

Differing from the second specific embodiment, in the fourth specific embodiment according to FIG. 4, third and fourth rims 155, 165 are attached on front side Sv' of substrate 110 in such a way that a first cavern 202 is limited by first rim 105, which is a part of substrate 110, and by third rim 155, attached on substrate 110, and a second cavern 212 is limited by second rim 115, which is a part of substrate 110, and by fourth rim 165, attached on substrate 110.

The side of first cavern 202 situated opposite upper side C103o of VIS array chip 103 is sealed by an optical lens device 201 designed for visible light. The side of second cavern 212 situated opposite upper side C113o of FIR array chip 113 is sealed by an infrared lens device 211.

Although the present invention has been completely described above on the basis of preferred specific embodiments, it is not limited thereto, but can be modified in many ways.

In particular, the indicated types of sensor chips and the indicated materials are given only as examples, and are not limiting.

What is claimed is:

1. An optical sensor chip device, comprising:
    a substrate having a front side and a rear side;
    at least one first optical sensor chip which is attached to the substrate to acquire a first optical spectral range;
    a first sealed cavern fashioned above an upper side of the first optical sensor chip, wherein the first optical sensor chip is situated on a first side of the first cavern, and a first optical device is situated on an opposite, second side of the first cavern; and
    a cap fashioned on the upper side of the optical sensor chip, the cap enclosing a hollow space having a vacuum.

2. The optical sensor chip device as recited in claim 1, wherein the first optical sensor chip is bonded, via its lower side, onto the front side of the substrate, and the first cavern being limited laterally by a rim that is attached on the front side of the substrate.

3. The optical sensor chip device as recited in claim 2, the rim covers the first sensor chip at least in some regions.

4. The optical sensor chip device as recited in claim 2, wherein the substrate is a semiconductor substrate or a glass substrate, and the rim being a molding compound.

5. The optical sensor chip device as recited in claim 1, wherein the first optical sensor chip has a through-plating that runs from the upper side to the lower side of the first optical sensor chip, and that is bonded to a through-plating of the substrate.

6. The optical sensor chip device as recited in claim 1, further comprising:
    at least one of a wake-up chip device and a microcontroller attached on the substrate.

7. An optical sensor chip device, comprising:
    a substrate having a front side and a rear side;
    at least one first optical sensor chip which is attached to the substrate to acquire a first optical spectral range;
    a first sealed cavern fashioned above an upper side of the first optical sensor chip, wherein the first optical sensor chip is situated on a first side of the first cavern, and a first optical device is situated on an opposite, second side of the first cavern;
    a second optical sensor chip to acquire a second optical spectral range; and
    a second sealed cavern fashioned above an upper side of the second optical sensor chip, the second optical sensor chip being situated on a first side of the second cavern, and a second optical device being situated on an opposite, second side of the second cavern.

8. The optical sensor chip device as recited in claim 7, wherein the first optical sensor chip is fashioned for acquiring visible light, and the second optical sensor chip is fashioned for acquiring electromagnetic radiation in the infrared range, and the first optical device and the second optical device being lens devices.

9. An optical sensor chip device, comprising:
    a substrate having a front side and a rear side;
    at least one first optical sensor chip which is attached to the substrate to acquire a first optical spectral range; and
    a first sealed cavern fashioned above an upper side of the first optical sensor chip, wherein the first optical sensor chip is situated on a first side of the first cavern, and a first optical device is situated on an opposite, second side of the first cavern;
    wherein the first optical sensor chip is bonded via its upper side onto the rear side of the substrate, and the first cavern is limited laterally at least in some regions by a through-hole running through the substrate.

10. The optical sensor chip device as recited in claim 9, wherein the first optical device is attached on the front side of the substrate at the through-hole.

11. The optical sensor chip device as recited in claim 10, wherein the first cavern above the substrate is limited laterally by a rim that is connected to the through-hole and that is attached on the front side of the substrate.

12. A method for producing an optical sensor chip device, comprising:
    providing a substrate having a front side and a rear side;
    attaching to the substrate at least one first optical sensor chip for acquiring a first optical spectral range; and
    forming a first sealed cavern above an upper side of the first optical sensor chip, the first optical sensor chip being situated on a first side of the first cavern, and a first optical device being situated on an opposite, second side of the first cavern;
    wherein the optical sensor chip is bonded via its upper side onto the rear side of the substrate, and a respective through-hole that runs through the substrate is formed, the cavern being laterally limited at least in some regions by a through-hole.

13. The method for producing an optical sensor chip device as recited in claim 12, further comprising:
    bonding the first chip via its respective lower side onto the front side of the substrate; and
    forming a rim so as to be attached on the front side of the substrate, the first cavern being laterally limited by the rim.

* * * * *